US012601645B2

(12) United States Patent
Hercowitz et al.

(10) Patent No.: US 12,601,645 B2
(45) Date of Patent: Apr. 14, 2026

(54) SELF-ADHESIVE STRAIN GAUGE ASSEMBLY INCLUDING FLEXIBLE PRINTED CIRCUIT BOARD

(71) Applicant: VISHAY ADVANCED TECHNOLOGIES, LTD., Modiin (IL)

(72) Inventors: Amos Hercowitz, Herzliya (IL); Niv Markel, Rosh Haayin (IL); Gilad Yaron, Modiin-Maccabim-Reut (IL); Hillel Menuhin, Rehovot (IL)

(73) Assignee: VISHAY ADVANCED TECHNOLOGIES, LTD., Modiin (IL)

( * ) Notice: Subject to any disclaimer, the term of this patent is extended or adjusted under 35 U.S.C. 154(b) by 338 days.

(21) Appl. No.: 18/354,208

(22) Filed: Jul. 18, 2023

(65) Prior Publication Data

US 2025/0027825 A1 Jan. 23, 2025

(51) Int. Cl.
| | |
|---|---|
| *H05K 1/18* | (2006.01) |
| *G01L 1/22* | (2006.01) |
| *H05K 1/189* | (2026.01) |

(52) U.S. Cl.
CPC .......... *G01L 1/2287* (2013.01); *G01L 1/2281* (2013.01); *H05K 1/189* (2013.01); *H05K 2201/10151* (2013.01)

(58) Field of Classification Search
CPC ..... G01L 1/2287; G01L 1/2281; H05K 1/189; H05K 2201/10151
USPC .......................................................... 361/749
See application file for complete search history.

(56) References Cited

U.S. PATENT DOCUMENTS

| | | | |
|---|---|---|---|
| 5,049,232 | A | 9/1991 | Tola |
| 5,241,133 | A | 8/1993 | Mullen, III et al. |
| 6,232,661 | B1 | 5/2001 | Amagai et al. |
| 6,818,469 | B2 | 11/2004 | Mori et al. |
| 7,042,087 | B2 | 5/2006 | Sakamoto et al. |
| 9,547,405 | B2 | 1/2017 | Oem et al. |
| 10,438,895 | B1 | 10/2019 | Hackler, Sr. |
| 11,137,241 | B2 | 10/2021 | Hercowitz et al. |
| 2002/0011122 | A1* | 1/2002 | Maeda ..................... G01L 5/223 |
| | | | 73/862.044 |
| 2002/0014673 | A1 | 2/2002 | Leedy |
| 2005/0229713 | A1 | 10/2005 | Niblock |
| 2010/0301473 | A1 | 12/2010 | Sasaoka |
| 2017/0172687 | A1 | 6/2017 | Smith et al. |
| 2018/0085061 | A1* | 3/2018 | Heisig ....................... G01B 7/20 |

(Continued)

FOREIGN PATENT DOCUMENTS

| | | |
|---|---|---|
| CN | 101266736 | 9/2008 |
| CN | 101644974 | 2/2010 |

(Continued)

OTHER PUBLICATIONS

European Search Report dated Feb. 25, 2022 which issued during the prosecution of Applicant's European App No. 21178550.6.

(Continued)

*Primary Examiner* — Binh B Tran

(74) *Attorney, Agent, or Firm* — Sughrue Mion, PLLC

(57) ABSTRACT

An integrated strain gauge assembly including at least one strain gauge having an adhesive adhered to a surface thereof and a flexible printed circuit board fixed to the at least one strain gauge. A method for mounting a strain gauge assembly onto a surface of an article the strain of which it is desired to monitor and/or measure.

18 Claims, 18 Drawing Sheets

(56) References Cited

U.S. PATENT DOCUMENTS

| | | | | |
|---|---|---|---|---|
| 2018/0217016 A1* | 8/2018 | Inamori | .................. | G01B 7/18 |
| 2019/0078953 A1 | 3/2019 | Huo et al. | | |
| 2020/0309505 A1 | 10/2020 | Hercowitz et al. | | |
| 2021/0396608 A1 | 12/2021 | Yaron et al. | | |

FOREIGN PATENT DOCUMENTS

| | | |
|---|---|---|
| CN | 105955534 | 9/2016 |
| CN | 106289594 | 1/2017 |
| CN | 109000553 | 12/2018 |
| EP | 0922935 | 6/1999 |
| EP | 0969264 | 1/2000 |
| EP | 3929528 | 3/2022 |
| EP | 3715810 | 3/2023 |
| JP | H04-38402 | 2/1992 |
| JP | H04-064279 | 2/1992 |
| JP | H04-162589 | 6/1992 |
| JP | 2000-111368 | 4/2000 |
| JP | 4758271 | 8/2011 |
| JP | 2012-047608 | 3/2012 |
| JP | 2016-085088 | 5/2016 |
| JP | 2019-066454 | 4/2019 |
| TW | 201539266 | 10/2015 |

OTHER PUBLICATIONS

European Search Report dated Jul. 17, 2020, which issued during the prosecution of Applicant's European App No. 19180601.7.
An Office Action summarized English translation and Search Report dated Jan. 19, 2023, which issued during the prosecution of Chinese Patent Application No. 201910773807.1.
An Office Action dated Oct. 15, 2023, which issued during the prosecution of Israel Patent Application No. 275618.
An Office Action dated Apr. 15, 2021, which issued during the prosecution of U.S. Appl. No. 16/366,502.
An Office Action dated Dec. 15, 2020, which issued during the prosecution of U.S. Appl. No. 16/366,502.
An Office Action dated Mar. 22, 2024, which issued during the prosecution of U.S. Appl. No. 17/352,909.
An Office Action dated Oct. 5, 2023, which issued during the prosecution of U.S. Appl. No. 17/352,909.
Notice of Allowance dated Jul. 18, 2024, which issued during the prosecution of U.S. Appl. No. 17/352,909.
Notice of Allowance dated Jun. 7, 2021, which issued during the prosecution of U.S. Appl. No. 16/366,502.
An Office Action dated Mar. 7, 2023, which issued during the prosecution of Japanese Patent Application No. 2019-117527.
An Office Action dated Feb. 16, 2021, which issued during the prosecution of European Patent Application No. 19180601.

* cited by examiner

AFTER STRAIN SURFACE CLEANING AND PROVIDING ALIGNMENT
MARKINGS ON THE STRAIN GAUGE SURFACE FOR MARKING THE
DESIRED STRAIN GAUGE POSITION ON THE STRAINABLE
SURFACE,
PROVIDE A SEPARATE GLASS SURFACE AND CLEAN THE GLASS
SURFACE WITH ISOPROPENOL OR ANOTHER CLEANING CHEMICAL

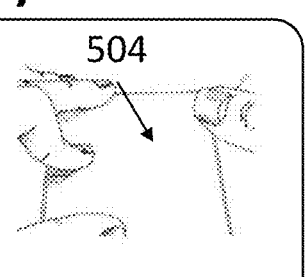

2

APPLY MYLAR TAPE OVER THE STRAIN GAUGE AND ENSURE
THAT THE MYLAR TAPE COVERS THE PADS OF THE STRAIN
GAUGE AND THAT THE ELONGATE AXIS OF THE MYLAR
TAPE IS ALIGNED WITH THE ELONGATE AXIS OF THE STRAIN GUAGE

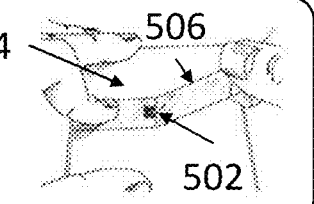

3

REMOVE THE MYLAR TAPE WITH THE STRAIN GAUGE ATTACHED
THERETO FROM THE GLASS SURFACE

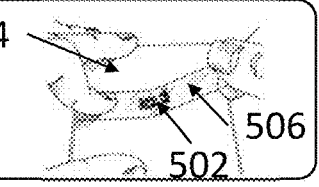

4

POSITION THE STRAIN GAUGE ADHERED TO THE MYLAR TAPE
ON THE STRAINABLE SURFACE BY USING THE ALIGNMENT MARKINGS

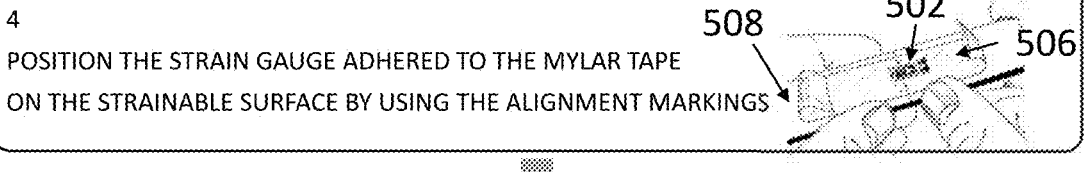

5

REMOVE THE STRAIN GAUGE WHILE ATTACHED TO THE MYLAR TAPE
FROM THE STRAINABLE SURFACE BY LIFTING THE END
OF THE MYLAR TAPE ADJACENT TO THE STRAIN GAUGE
AT A SHALLOW ANGLE TO THE STRAINABLE SURFACE

6

APPLY ADHESIVE TO THE BACK SURFACE OF THE STRAIN GAUGE

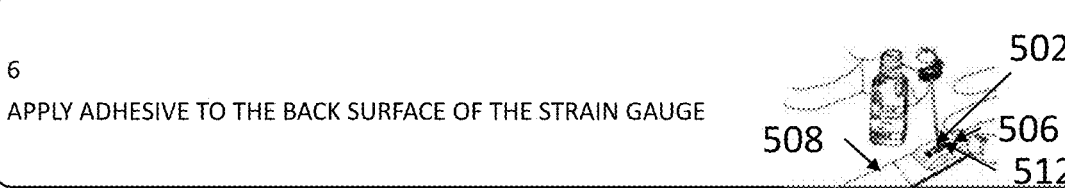

Fig. 5A-2 (PRIOR ART)

7
APPLY ADHESIVE TO THE LOCATION ON THE STRAINABLE SURFACE
WHICH WILL UNDERLIE THE STRAIN GAUGE
508    502    512    506

8
WAIT 5-30 MINUTES
508    502    512    506

9
REMOVE EXCESS ADHESIVE FROM THE BACK SURFACE OF
THE STAIN GAUGE AND FIX THE STRAIN GAUGE TO THE STRAINED
SURFACE AT THE DESIRED STRAIN GAUGE POSITION THEREON
502    506    508

10
REPEAT STEPS 1 -9 FOR EACH STRAIN GAUGE TO BE MOUNTED ON THE STRAINABLE SURFACE

11
PROVIDE A STACKED ARRANGEMENT OF TEFLON AND
RUBBER OVERLYING THE STRAIN GAUGES AND
STRAINABLE SURFACE
Metal   Rubber   Teflon
508   Strainable surface   Gauge   502

12
CLAMP THE STACKED ARRANGEMENT TO APPLY PRESSURE
TO THE STRAIN GAUGES AND THE STRAINABLE SURFACE
508    502

13
ACTIVATE THE ADHESIVE AS BY APPLYING HEAT TO THE STRAINABLE SURFACE HAVING THE
STRAIN GAUGES MOUNTED THEREON

14
BOND A FLEXIBLE CIRCUIT BOARD ONTO THE FRONT SURFACES OF
THE STRAIN GAUGES AND OVER THE STRAINEABLE SURFACE
508   524   502
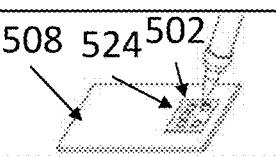

Fig. 5B-1 (PRIOR ART)

1
AFTER STRAINABLE SURFACE CLEANING AND PROVIDING ALIGNMENT
MARKINGS ON THE STRAIN GAUGES AND THE FLEXIBLE PRINTED
CIRCUIT  BOARD FOR MARKING  THE POSITION OF THE DESIRED
STRAIN GAUGE AND FLEXIBLE PRINTED CIRCUIT ATTACHED THERETO
ON THE STRAINABLE  SURFACE,
PROVIDE A SEPARATE GLASS SURFACE AND CLEAN THE GLASS
SURFACE WITH ISOPROPENOL OR ANOTHER CLEANING CHEMICAL

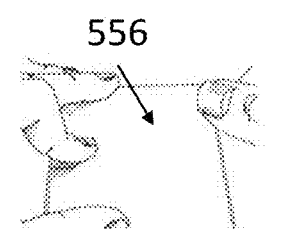

2
APPLY MYLAR TAPE OVER  THE STRAIN GAUGE AND FLEXIBLE
PRINTED CIRCUIT ATTACHED THERETO
AND ENSURE THAT THE MYLAR TAPE
COVERS THE PADS OF THE STRAIN GAUGES
AND THAT THE ELONGATE AXIS OF THE MYLAR
TAPE IS ALIGNED WITH THE ELONGATE AXES OF THE STRAIN GUAGES

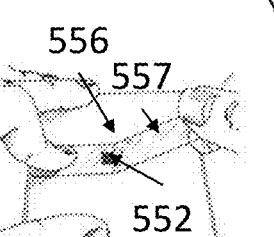

3
REMOVE THE MYLAR TAPE TOGETHER WITH THE STRAIN GAUGES AND
FLEXIBLE PRINTED CIRCUIT  ATTACHED
THERETO FROM THE GLASS SURFACE

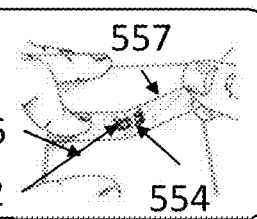

4
POSITION THE STRAIN GAUGES AND FLEXIBLE PRINTED CIRCUIT
ATTACHED THERETO  WHILE  ADHERED TO THE MYLAR TAPE
ON THE STRAINABLE SURFACE BY USING THE ALIGNMENT MARKINGS

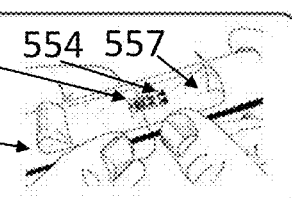

5
REMOVE THE STRAIN GAUGES AND FLEXIBLE PRINTED CIRCUIT
ATTACHED THERTO, WHILE ADHERED TO THE MYLAR TAPE
FROM THE STRAINABLE SURFACE BY LIFTING THE END
OF THE MYLAR TAPE ADJACENT TO THE STRAIN GAUGES AND FLEXIBLE
PRINTED CIRCUIT ATTACHED THERETO AT A SHALLOW ANGLE
TO THE PLANE OF THE  STRAINABLE SURFACE

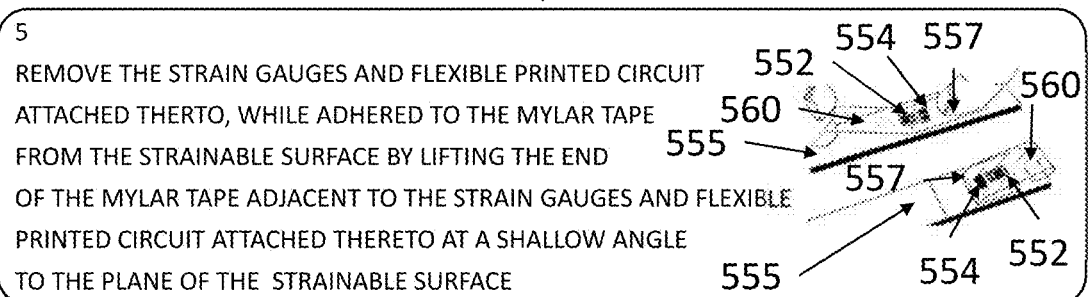

Fig. 5B-2 ⬇ (PRIOR ART)

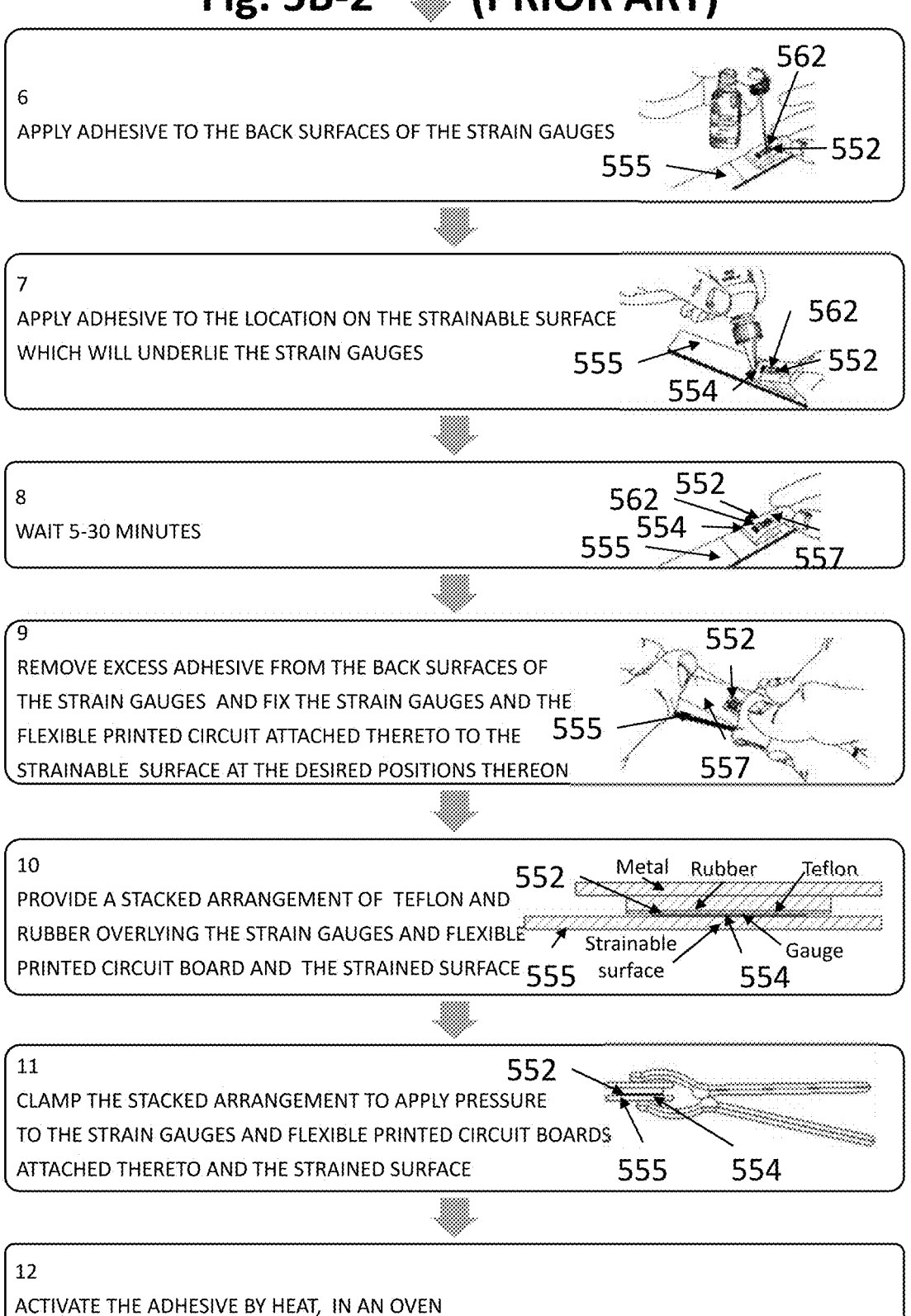

6

APPLY ADHESIVE TO THE BACK SURFACES OF THE STRAIN GAUGES

562

555          552

⬇

7

APPLY ADHESIVE TO THE LOCATION ON THE STRAINABLE SURFACE
WHICH WILL UNDERLIE THE STRAIN GAUGES          555          562
554          552

⬇

8

WAIT 5-30 MINUTES          562 552
555 554          557

⬇

9

REMOVE EXCESS ADHESIVE FROM THE BACK SURFACES OF
THE STRAIN GAUGES  AND FIX THE STRAIN GAUGES AND THE
FLEXIBLE PRINTED CIRCUIT ATTACHED THERETO TO THE          555
STRAINABLE  SURFACE AT THE DESIRED POSITIONS THEREON          557          552

⬇

10

PROVIDE A STACKED ARRANGEMENT OF  TEFLON AND
RUBBER OVERLYING THE STRAIN GAUGES AND FLEXIBLE
PRINTED CIRCUIT BOARD AND  THE STRAINED SURFACE          552          Metal   Rubber   Teflon
Strainable          Gauge
555          surface          554

⬇

11

CLAMP THE STACKED ARRANGEMENT TO APPLY PRESSURE
TO THE STRAIN GAUGES AND FLEXIBLE PRINTED CIRCUIT BOARDS
ATTACHED THERETO AND THE STRAINED SURFACE          552
555          554

⬇

12

ACTIVATE THE ADHESIVE BY HEAT,  IN AN OVEN

Fig. 6

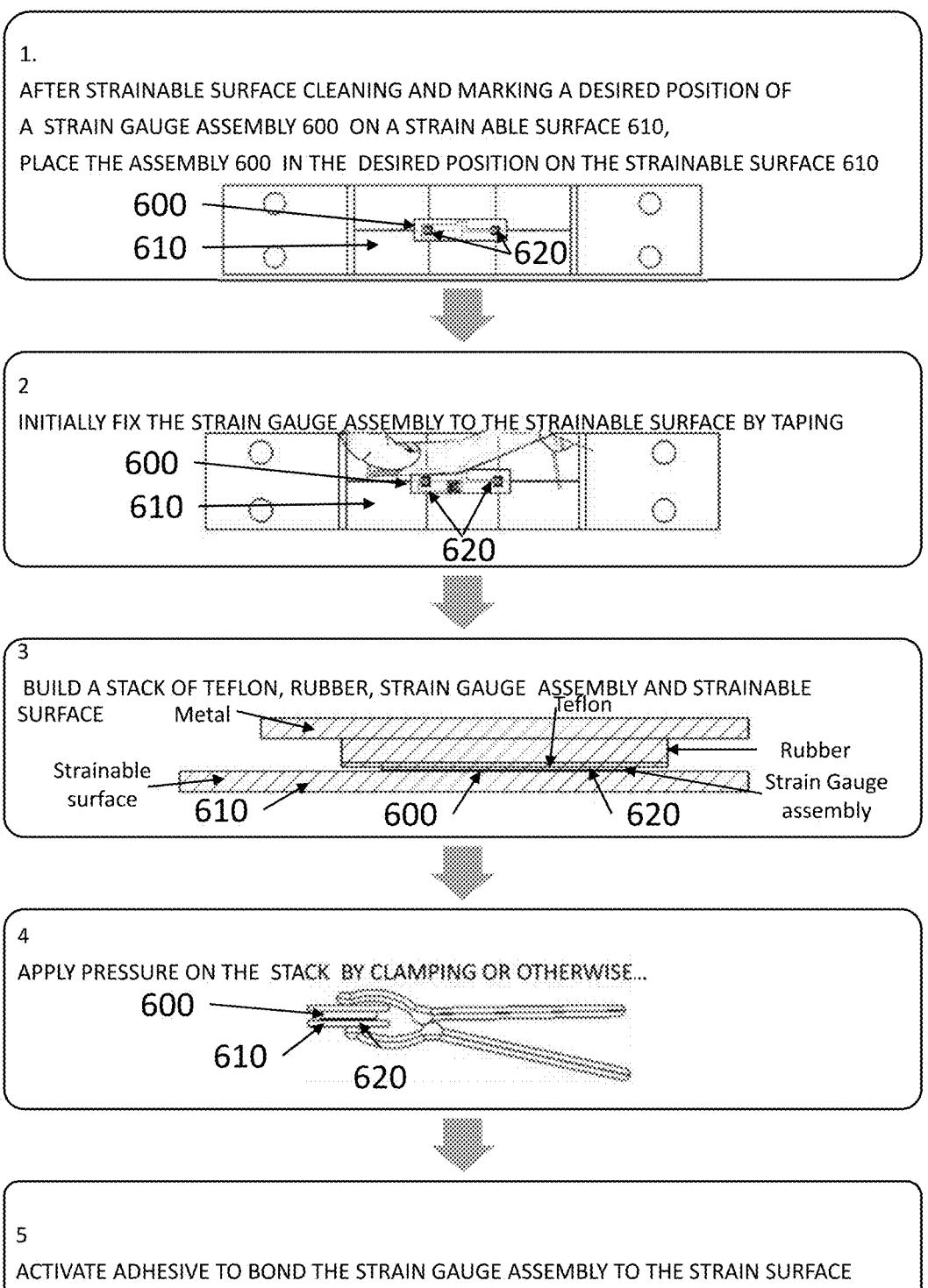

1.

AFTER STRAINABLE SURFACE CLEANING AND MARKING A DESIRED POSITION OF
A STRAIN GAUGE ASSEMBLY 600 ON A STRAIN ABLE SURFACE 610,
PLACE THE ASSEMBLY 600 IN THE DESIRED POSITION ON THE STRAINABLE SURFACE 610

600
610
620

2

INITIALLY FIX THE STRAIN GAUGE ASSEMBLY TO THE STRAINABLE SURFACE BY TAPING 600
610
620

3

BUILD A STACK OF TEFLON, RUBBER, STRAIN GAUGE ASSEMBLY AND STRAINABLE
SURFACE    Metal         Teflon Strainable surface     Rubber
    Strain Gauge assembly 610      600      620

4

APPLY PRESSURE ON THE STACK BY CLAMPING OR OTHERWISE...

600
610
620

5

ACTIVATE ADHESIVE TO BOND THE STRAIN GAUGE ASSEMBLY TO THE STRAIN SURFACE

SELF-ADHESIVE STRAIN GAUGE ASSEMBLY INCLUDING FLEXIBLE PRINTED CIRCUIT BOARD

FIELD OF THE INVENTION

The present invention relates to strain gauges generally and more particularly to the structure and mounting of strain gauge assemblies.

BACKGROUND OF THE INVENTION

Various types of strain gauges are known, as are strain gauges, onto which are premounted flexible printed circuit boards. The mounting of such strain gauges, on objects whose strain is to be sensed, is a relatively complex and time consuming and labor consuming task.

SUMMARY OF THE INVENTION

The present invention seeks to provide an improved strain gauge assembly, the mounting of which, onto a strainable surface of an object whose strain is to be sensed, is relatively straightforward and to a method of mounting the strain gauge assembly.

There is thus provided in accordance with a preferred embodiment of the present invention an integrated strain gauge assembly including at least one strain gauge having an adhesive adhered to a surface thereof and a flexible printed circuit board fixed to the at least one strain gauge.

In accordance with a preferred embodiment of the present invention the flexible printed circuit board is formed with at least one window at least partially overlying the at least one strain gauge.

Preferably, the flexible printed circuit board is formed with at least one conductor shaped as a partial outline of a pad. Additionally, the integrated strain gauge assembly also includes at least one pad-defining metal deposit adhered to the flexible printed circuit board and partially surrounded by the at least one conductor shaped as a partial outline of a pad.

In accordance with a preferred embodiment of the present invention, the integrated strain gauge assembly also includes at least one circuit component mounted onto the flexible printed circuit board.

Preferably, the at least one circuit component includes a temperature measuring circuit. Additionally or alternatively, the at least one circuit component includes a passive electronic component. Additionally or alternatively, the at least one circuit component includes an active electronic component. Additionally or alternatively, the at least one circuit component includes a battery. Additionally or alternatively, the at least one circuit component at least one integrated circuit. Additionally or alternatively, the at least one circuit component includes a flexible electronic component.

There is also provided in accordance with another preferred embodiment of the present invention a method for mounting a strain gauge assembly onto a strainable surface, the method including providing a strain gauge assembly, the strain gauge assembly including at least one strain gauge having an adhesive adhered to a surface thereof and a flexible printed circuit board fixed to the at least one strain gauge, locating the strain gauge assembly at a desired strain gauge assembly position on the strainable surface and initially fixing the strain gauge assembly at the desired strain gauge assembly position on the strainable surface.

Additionally, the method also includes providing a stacked arrangement overlying the strain gauge assembly and the strainable surface, applying pressure to the stacked arrangement, thereby applying pressure to the strain gauge assembly and the strainable surface and bonding the strain gauge assembly to the strainable surface by activating the adhesive.

BRIEF DESCRIPTION OF THE DRAWINGS

The present invention will be understood and appreciated more fully from the following detailed description, taken together with the drawings in which:

FIGS. 5A-1 and 5A-2 are, together, a simplified illustration of a first prior art method of mounting strain gauges onto a strainable surface;

FIGS. 5B-1 and 5B-2 are, together, a simplified illustration of a prior art method of mounting strain gauges premounted onto a flexible printed circuit board onto a strainable surface; and FIG. 6 is a simplified illustration of a method of mounting a strain gauge assembly onto a strainable surface in accordance with an embodiment of the present invention.

DETAILED DESCRIPTION OF PREFERRED EMBODIMENTS

Reference is now made to FIGS. 1A, 1B, 1C and 1D which are, respectively, simplified plan view, exploded view and first and second sectional illustrations of a strain gauge assembly, constructed and operative in accordance with a preferred embodiment of the present invention.

As seen in FIGS. 1A-1D, there is provided a strain gauge assembly 100, preferably including a plurality of strain gauges 102, onto which is mounted, as by soldering, a back surface 104 of a flexible printed circuit board 106. Strain gauges 102 may be any suitable strain gauge, one example of which is a Model MMF404432, commercially available from VISHAY ADVANCED TECHNOLOGIES, LTD. The flexible printed circuit board 106 may be any suitable flexible printed circuit board, one example of which is a Model W291842ASH116, commercially available from PCBWay.Com.

Figure 1A:
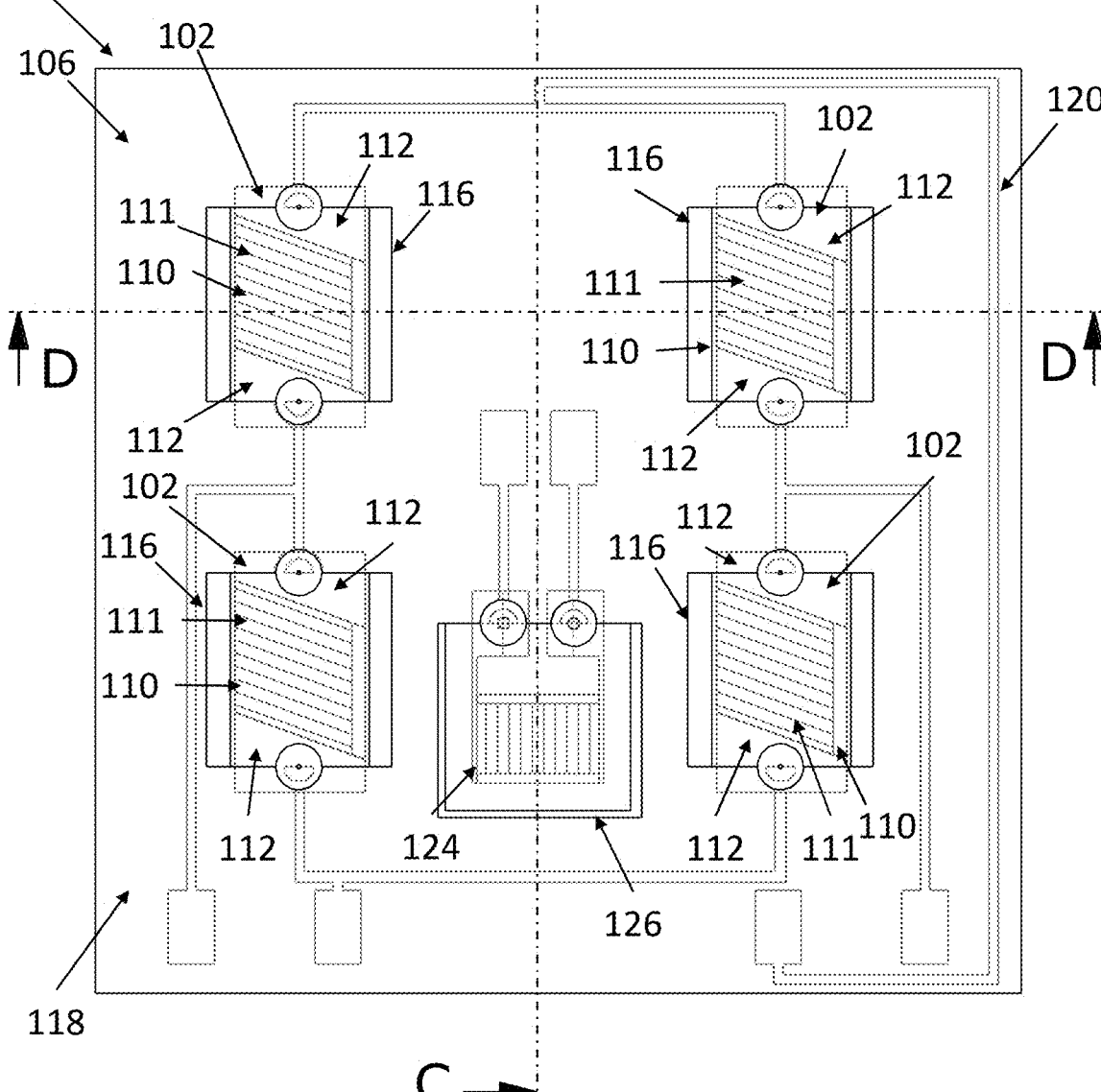
FIGS. 1A, 1B, 1C and 1D are, respectively, simplified plan view, exploded view and first and second sectional illustrations of a strain gauge assembly, constructed and operative in accordance with a preferred embodiment of the present invention.
Figure 1B:
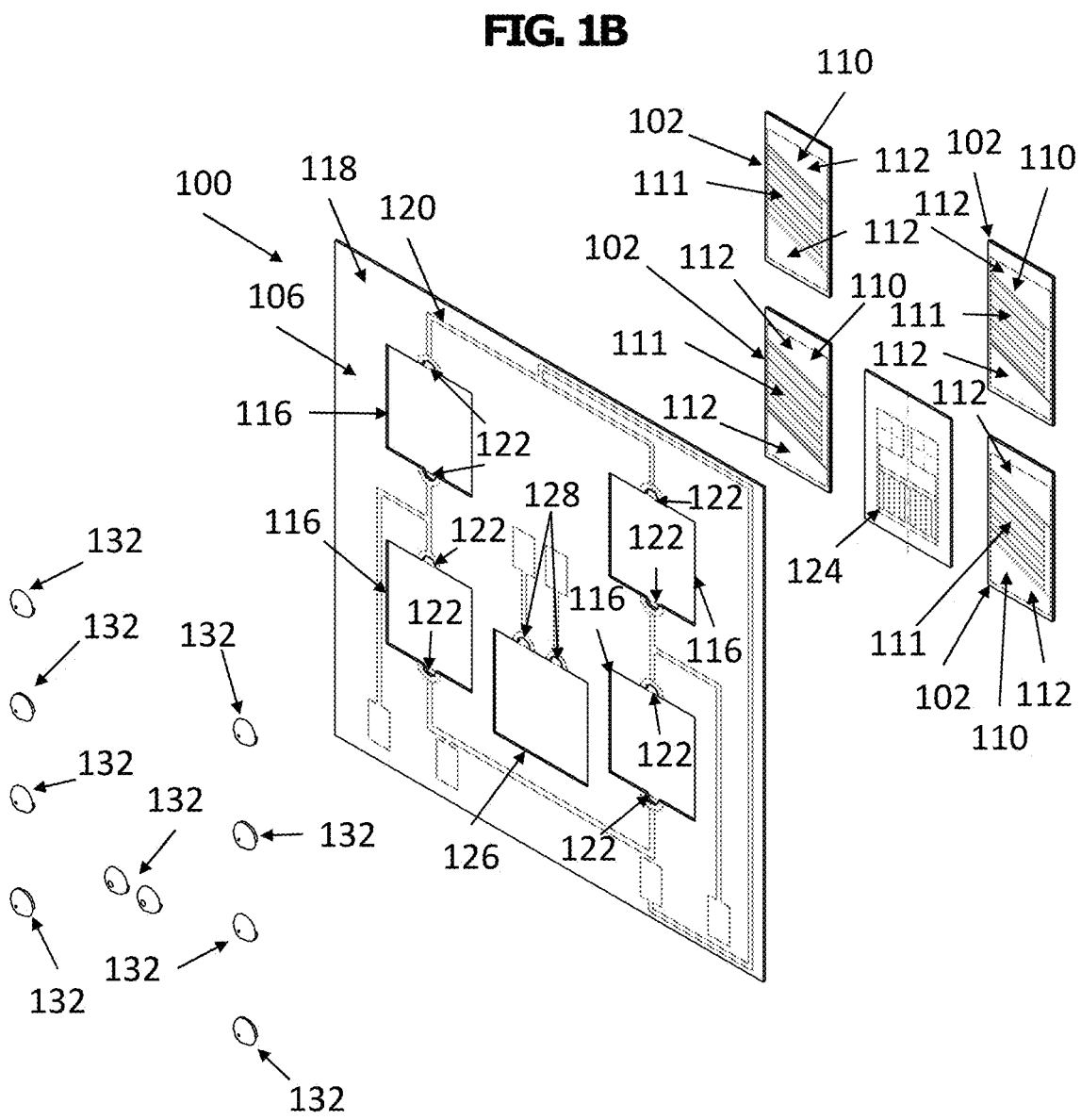
Figure 1C:
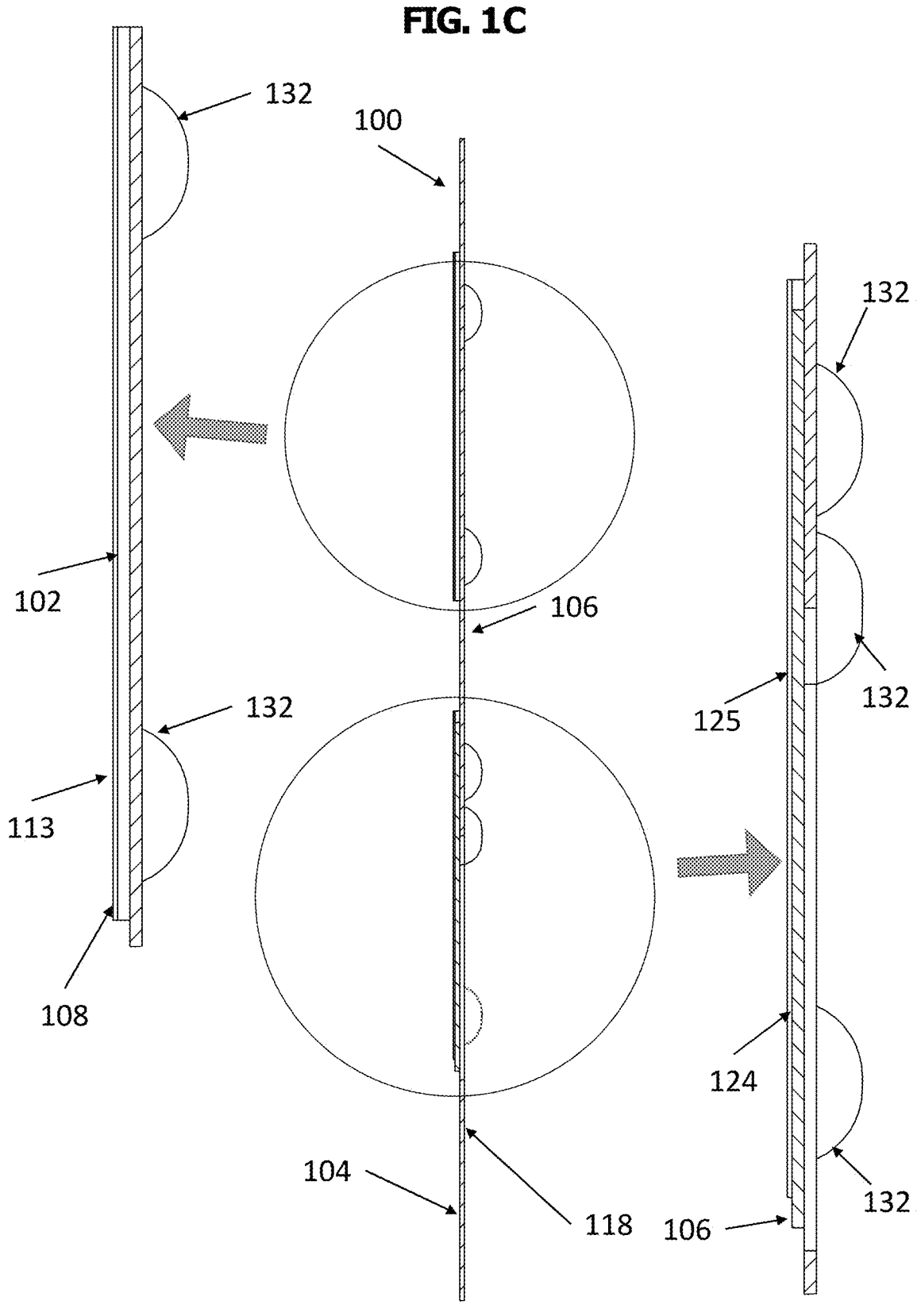
Figure 1D:
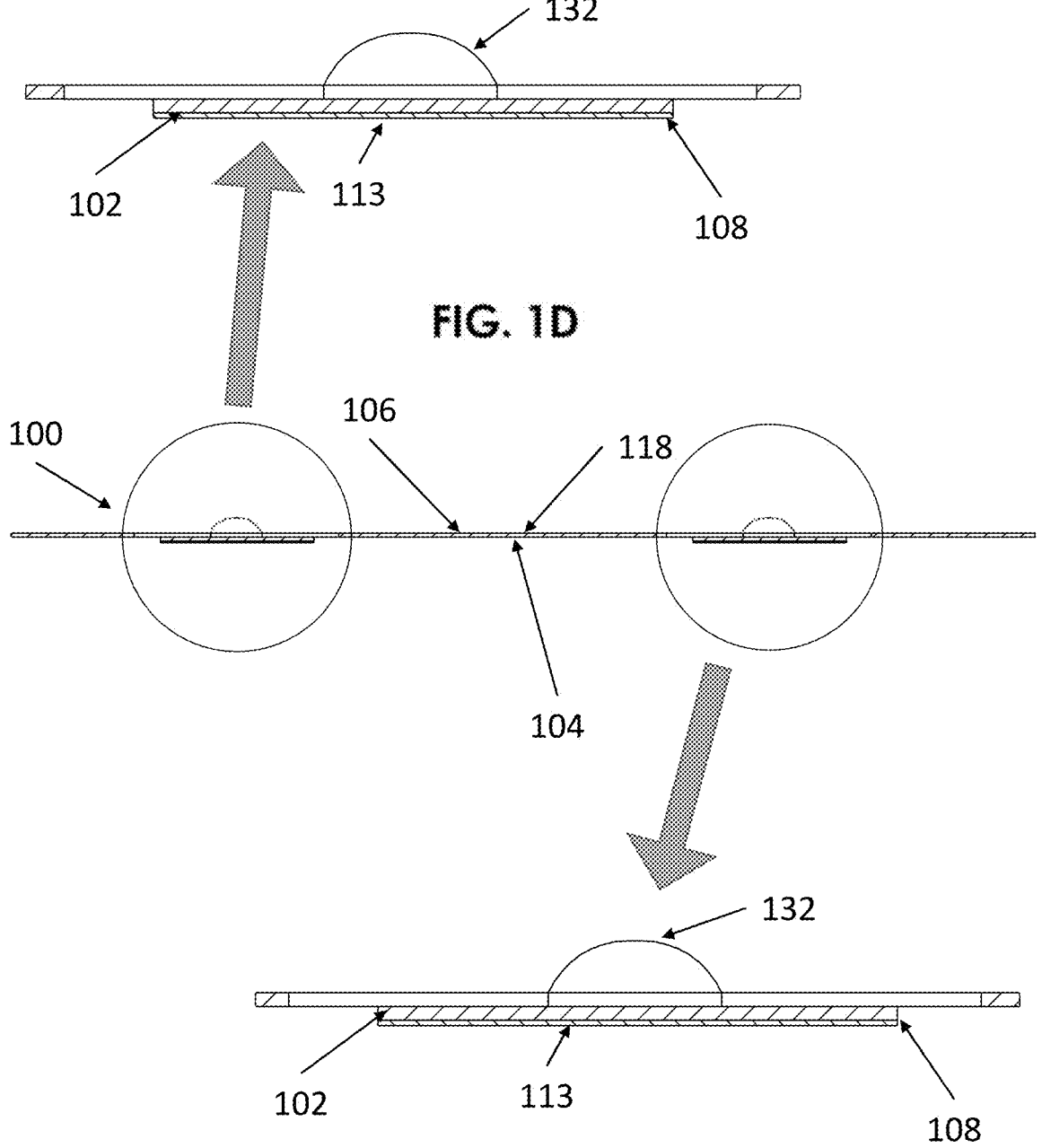

Strain gauges 102 each include a back surface 108 and a front surface 110. The front surface 110 of each strain gauge 102, which is seen clearly in FIGS. 1A and 1B, is formed with a patterned conductor 111 and at least two pads 112. It is a particular feature of an embodiment of the present invention that at least one of, and preferably all of, the strain gauges 102 are self-adhesive strain gauges, such as a Model MMF404432, commercially available from VISHAY ADVANCED TECHNOLOGIES, LTD, in which the back surface 108 of each of the strain gauges 102 is pre-formed with an adhesive 113, preferably a layer of M-bond 43-B, commercially available from VISHAY ADVANCED TECHNOLOGIES, LTD, which is preferably applied by spin coating.

Preferably, the strain gauges 102 each are aligned with a window 116 cut out of the flexible printed circuit board 106, such that the front surface 110 of each strain gauge 102 may be visible from a front surface 118 of the flexible printed circuit board 106.

Preferably, the front surface 118 of the printed circuit board 106 is formed with a patterned conductor 120. Preferably, adjacent at least one edge of each window 116, the patterned conductor 120 defines a partial outline 122 of a pad in the shape of a protrusion, here shown as a semicircle.

In the illustrated embodiment of FIGS. 1A-1D, there may also be a flexible component, such as a temperature measuring circuit 124, such as a MMF006911, commercially available from VISHAY ADVANCED TECHNOLOGIES, LTD, which may include a resistance temperature detector (RTD), which may be mounted onto the back surface 104 of the flexible printed circuit board 106, in a manner similar to the mounting of the strain gauges 102. As seen in the illustrated embodiment, temperature measuring circuit 124 may also include an adhesive layer 125. Adhesive layer 125 may also be obviated.

In the illustrated embodiment, a window 126 cut out of the flexible printed circuit board 106 is provided, such that the temperature measuring circuit 124 may be visible from front surface 118 of the flexible printed circuit board 106. As illustrated, preferably adjacent at least one edge of window 126, the patterned conductor 120 defines a partial outline 128 of a pad in the shape of a protrusion, here shown as a semicircle.

In accordance with a preferred embodiment of the present invention, a plurality of pad-defining metal deposits 132, such as solder balls, are adhered to the flexible printed circuit board 106 and are partially surrounded by partial outlines 122 and 128. It is a particular feature of the invention that the partial outlines 122 and 128 enable ease of providing the metal deposits so that they simultaneously conductively engage both the patterned conductor 120 of the flexible printed circuit board 106 and either at least one pad 112 of each of the strain gauges 102 or temperature measuring circuit 124.

Figures 2A, 2B:
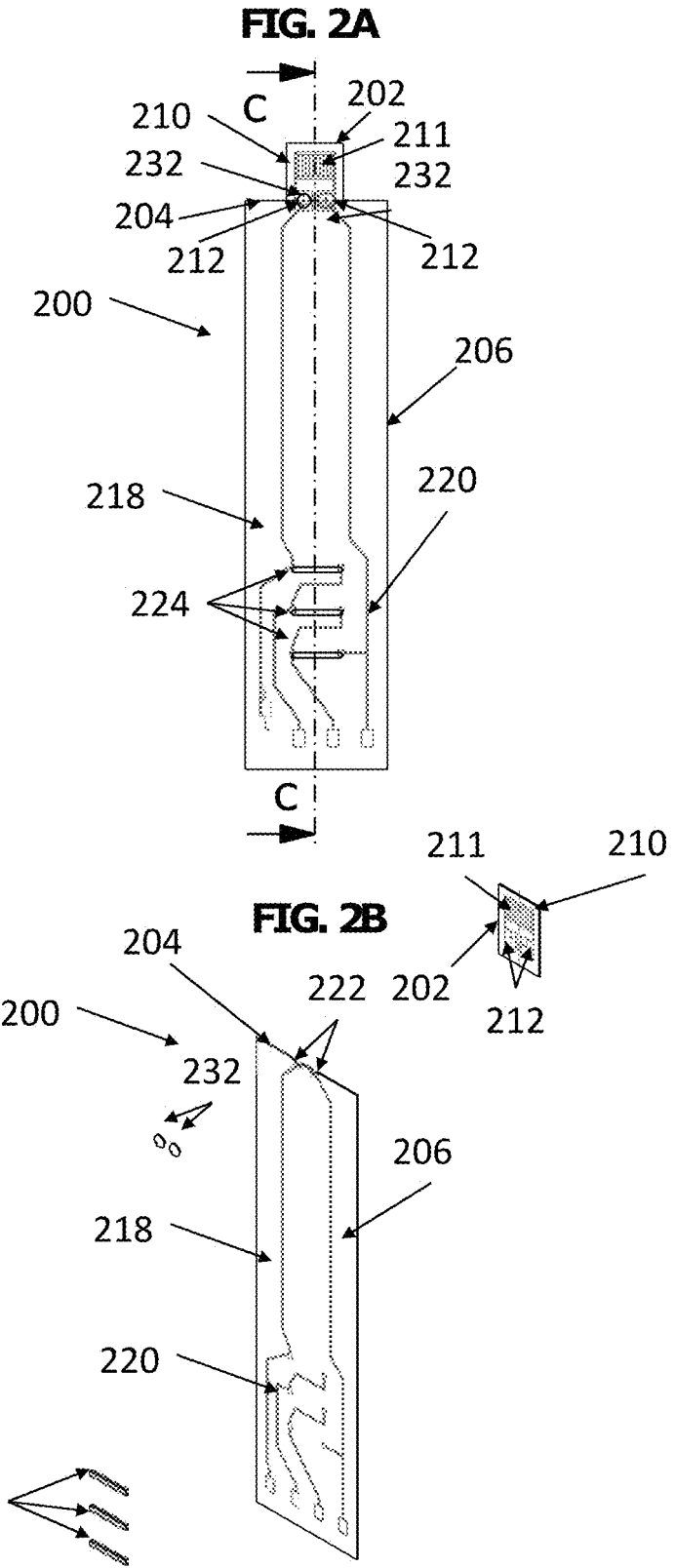
FIGS. 2A, 2B and 2C are, respectively, simplified plan view, exploded view and sectional illustrations of a strain gauge assembly, constructed and operative in accordance with another preferred embodiment of the present invention.
Figure 2C:
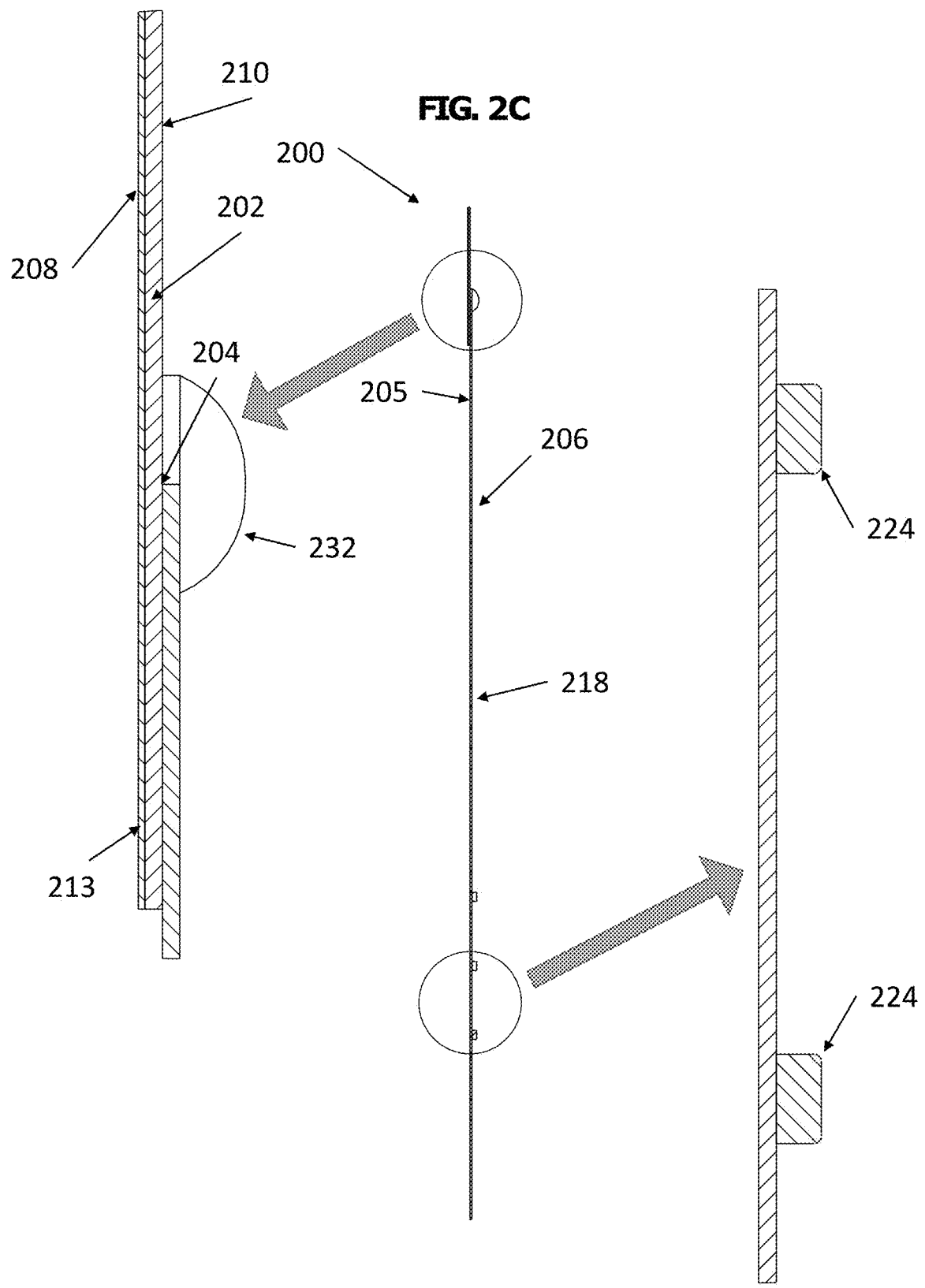

Reference is now made to FIGS. 2A, 2B and 2C, which are, respectively, simplified plan view, exploded view and sectional illustrations of a strain gauge assembly, constructed and operative in accordance with another preferred embodiment of the present invention.

As seen in FIGS. 2A-2C, there is provided a strain gauge assembly 200 preferably including a strain gauge 202 which is mounted, as by soldering, onto a top edge surface 204 and a back surface 205 of a flexible printed circuit board 206. Strain gauge 202 may be any suitable strain gauge, one example of which is a Model MMF404432, commercially available from VISHAY ADVANCED TECHNOLOGIES, LTD. The flexible printed circuit board 206 is preferably a flexible circuit board commercially available from PCB-Way.Com.

Strain gauge 202 includes a back surface 208 and a front surface 210. The front surface of strain gauge 202, which is seen clearly in FIGS. 2A and 2B, is formed with a patterned conductor 211 and at least two pads 212. It is a particular feature of an embodiment of the present invention that strain gauge 202 is a self-adhesive strain gauge, such as a Model MMF404432, commercially available from VISHAY ADVANCED TECHNOLOGIES, LTD, in which the back surface 208 of strain gauge 202 is pre-formed with an adhesive 213, preferably a layer of M-bond 43-B, commercially available from VISHAY ADVANCED TECHNOLOGIES, LTD, which is preferably applied by spin coating.

Preferably, a front surface 218 of the flexible printed circuit board 206 is formed with a patterned conductor 220. Preferably adjacent at least one edge of the printed circuit board, preferably that adjacent the strain gauge 202, the patterned conductor 220 defines a partial outline 222 of a pad in the shape of a protrusion, here shown as a semicircle.

In the illustrated embodiment of FIGS. 2A-2C, there is preferably also provided a plurality of circuit components 224, here shown as resistors, which may be mounted onto the front surface 218 of the flexible printed circuit board 206 in a conventional manner.

In accordance with a preferred embodiment of the present invention, a plurality of pad-defining metal deposits 232, such as solder balls, are adhered to the flexible printed circuit board 206 and are partially surrounded by partial outlines 222. It is a particular feature of the invention that the partial outline 222 enables ease of providing the metal deposits so that they simultaneously conductively engage both the patterned conductor 220 of the flexible printed circuit board 206 and at least one pad 212 of the strain gauge 202.

Reference is now made to FIGS. 3A, 3B, 3C and 3D which are, respectively, simplified plan view, exploded view and first and second sectional illustrations of a strain gauge assembly, constructed and operative in accordance with yet another preferred embodiment of the present invention.

As seen in FIGS. 3A-3D, there is provided a strain gauge assembly 300, preferably including at least one strain gauge 302, which is mounted, as by soldering, onto a back surface 304 of a flexible printed circuit board 306, preferably, as seen in the illustrated embodiment, at a top edge 307 thereof. The at least one strain gauge 302 may be any suitable strain gauge, one example of which is a Model MMF404432, commercially available from VISHAY ADVANCED TECHNOLOGIES, LTD. The flexible printed circuit board 306 is preferably a flexible circuit board commercially available from PCBWay.Com.

Figures 3A, 3B:
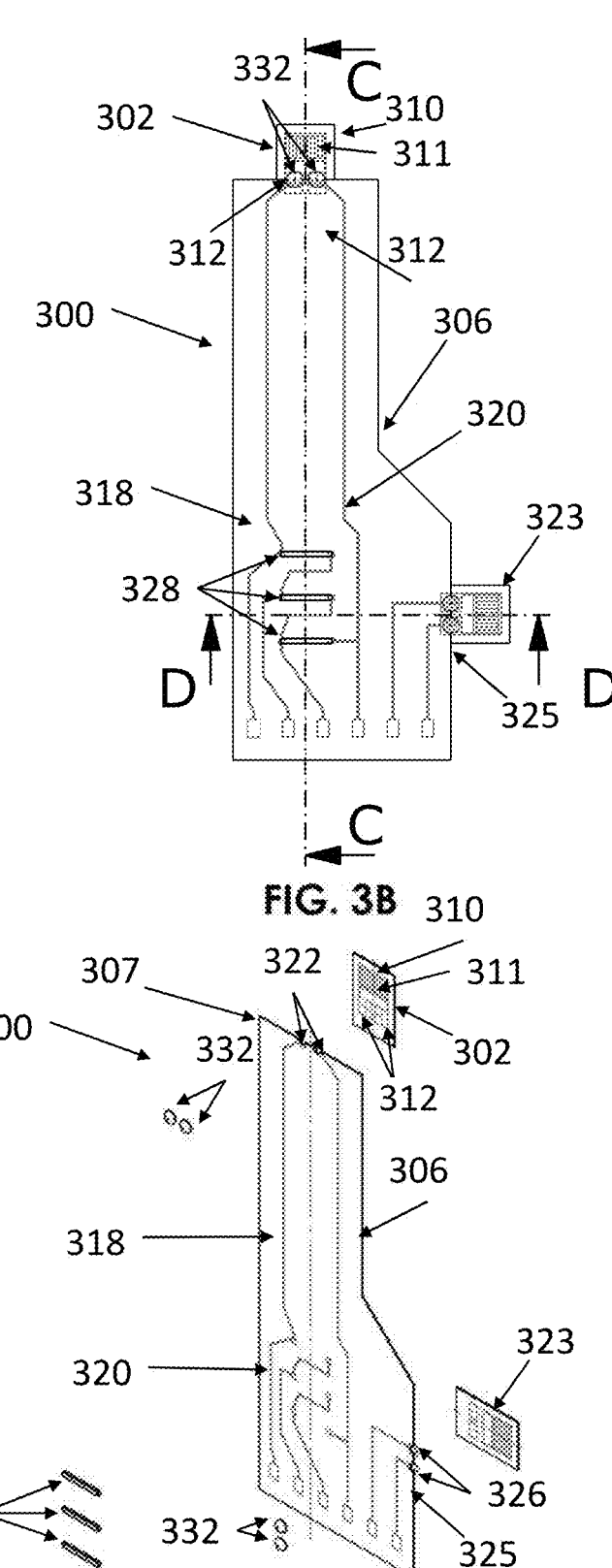
FIGS. 3A, 3B, 3C and 3D are, respectively, simplified plan view, exploded view and first and second sectional illustrations of a strain gauge assembly, constructed and operative in accordance with yet another preferred embodiment of the present invention.
Figure 3C:
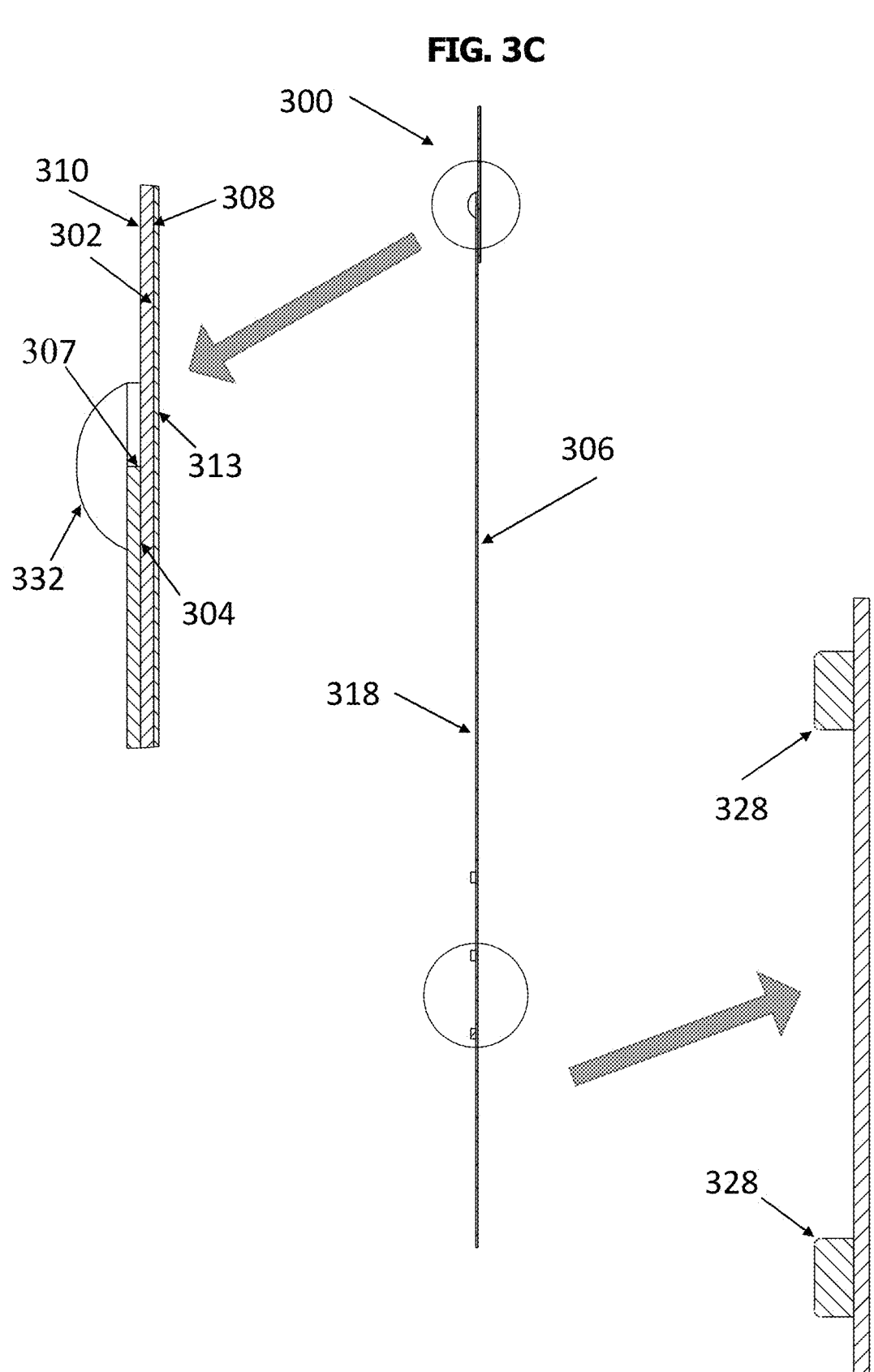
Figure 3D:
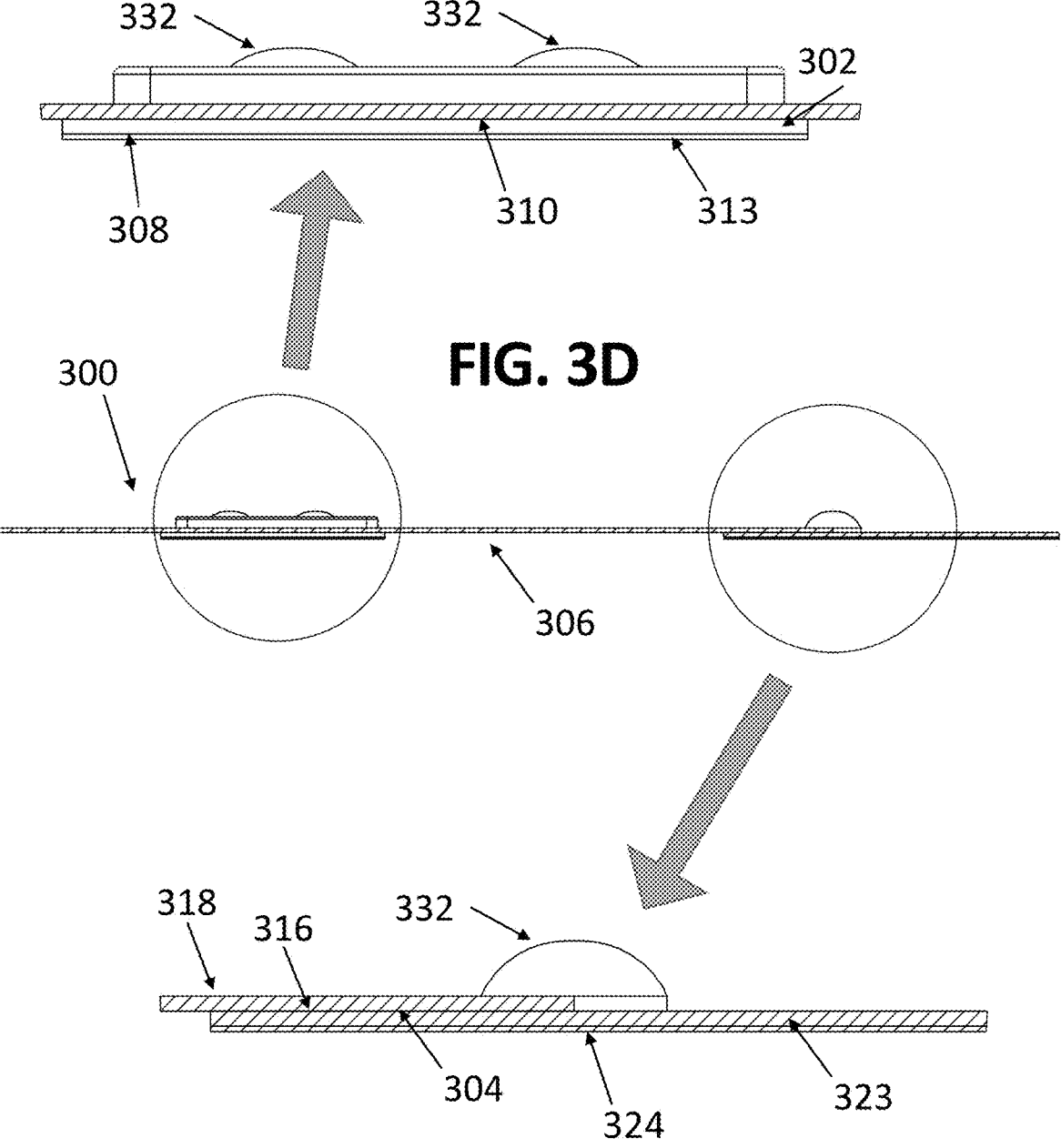

Each of the at least one strain gauge 302 include a back surface 308 and a front surface 310. The front surface 310 of each strain gauge 302, which is seen clearly in FIGS. 3A and 3B, is formed with a patterned conductor 311 and at least two pads 312. It is a particular feature of an embodiment of the present invention that at least one of the at least one strain gauge is a self-adhesive strain gauge, such as a Model MMF404432, commercially available from VISHAY ADVANCED TECHNOLOGIES, LTD, in which the back surface 308 of each of the at least one strain gauge 302 is pre-formed with an adhesive 313, preferably a layer of M-bond 43-B, commercially available from VISHAY ADVANCED TECHNOLOGIES, LTD, which is preferably applied by spin coating.

Preferably, a front surface 318 of the printed circuit board 306 is formed with a patterned conductor 320. Preferably adjacent at least two edges of the printed circuit board 306, the patterned conductor 320 defines a partial outline 322 of a pad in the shape of a protrusion, here shown as a semicircle.

In the illustrated embodiment of FIGS. 3A-3D, there may also be a flexible component, such as a temperature measuring circuit 323, such as a MMF006911, commercially available from VISHAY ADVANCED TECHNOLOGIES, LTD, which may include a resistance temperature detector (RTD), which may be mounted onto back surface 304 of the flexible printed circuit board 306, in a manner similar to the mounting of the at least one strain gauge 302. As seen in the illustrated embodiment, temperature measuring circuit 323 may also include an adhesive layer 324. Adhesive layer 324 may also be obviated.

In contrast to the embodiment of FIGS. 1A-1D, where window 126 cut out of the flexible printed circuit board 106 is provided, such that the temperature measuring circuit 124 may be visible from front surface 118 of the flexible printed circuit board 106, in the embodiment of FIGS. 3A-3D, temperature measuring circuit 323 is preferably mounted on an edge 325 of printed circuit board 306. As illustrated, preferably adjacent edge 325 of printed circuit board 306, the patterned conductor 320 defines at least one partial outline 326 of a pad in the shape of a protrusion, here shown as a semicircle.

In the illustrated embodiment of FIGS. 3A-3D, there is preferably also provided a plurality of circuit components 328, here shown as resistors, which may be mounted onto the front surface 318 of the flexible printed circuit board 306 in a conventional manner.

In accordance with a preferred embodiment of the present invention, a plurality of pad-defining metal deposits 332, such as solder balls, are adhered to the flexible printed circuit board 306 and are partially surrounded by partial outlines 322 and 326. It is a particular feature of the invention that the partial outlines 322 and 326 enable ease of providing the metal deposits so that they simultaneously conductively engage both the patterned conductor 320 of the flexible printed circuit board 306 and either at least one pad 312 of each of the strain gauges 302 or temperature measuring circuit 323.

Reference is now made to FIGS. 4A, 4B, 4C and 4D which are, respectively, simplified plan view, exploded view and first and second sectional illustrations of a strain gauge assembly, constructed and operative in accordance with still another preferred embodiment of the present invention.

As seen in FIGS. 4A-4D, there is provided a strain gauge assembly 400 preferably including a plurality of strain gauges 402, which are mounted, as by soldering, onto a back surface 404 of a flexible printed circuit board 406. Strain gauges 402 may be any suitable strain gauge, one example of which is a Model MMF404432, commercially available from VISHAY ADVANCED TECHNOLOGIES, LTD. The flexible printed circuit board 406 is preferably a flexible circuit board commercially available from PCBWay.Com.

Figure 4A:
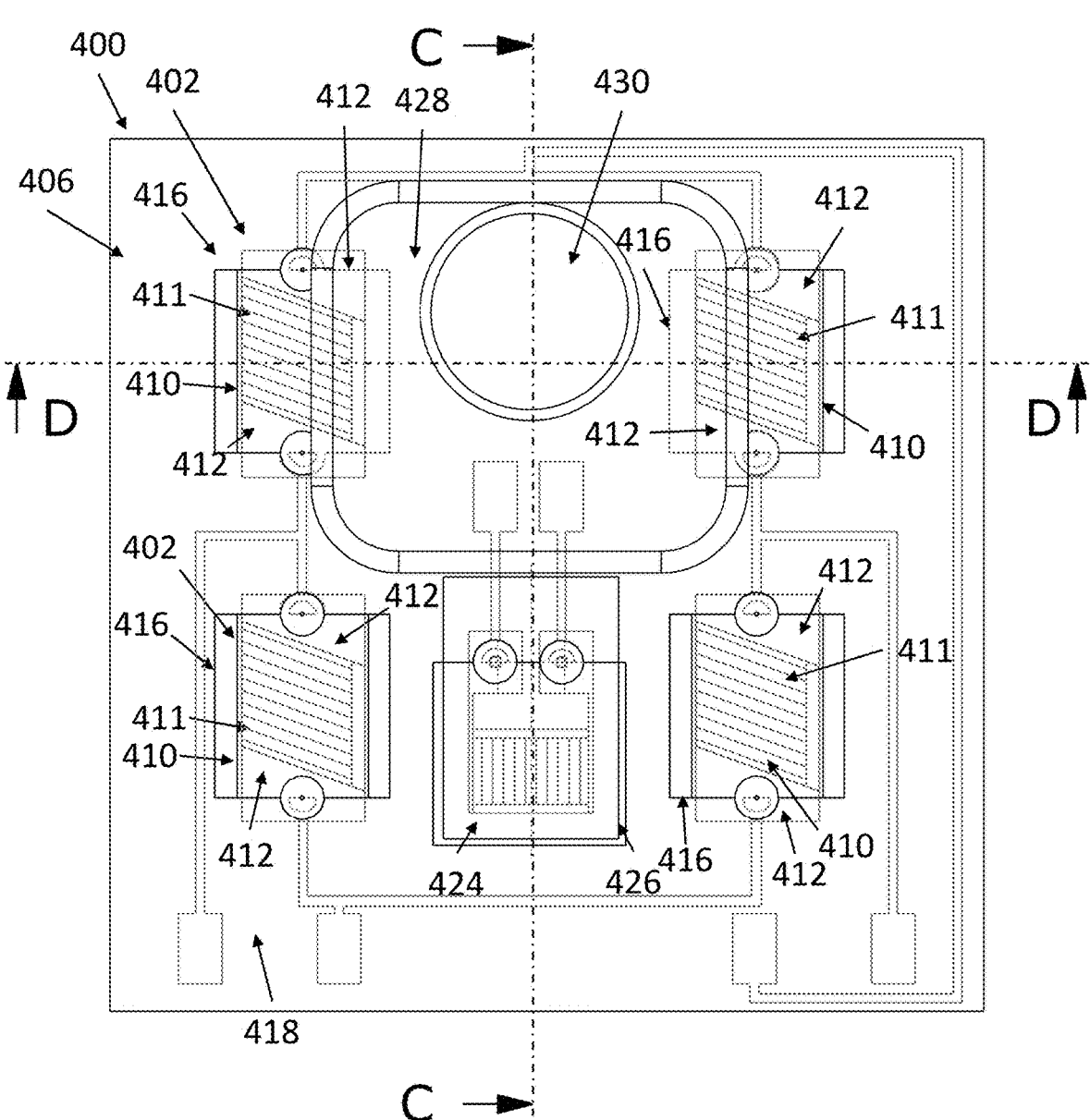
FIGS. 4A, 4B, 4C and 4D are, respectively, simplified plan view, exploded view and first and second sectional illustrations of a strain gauge assembly, constructed and operative in accordance with still another preferred embodiment of the present invention.
Figure 4B:
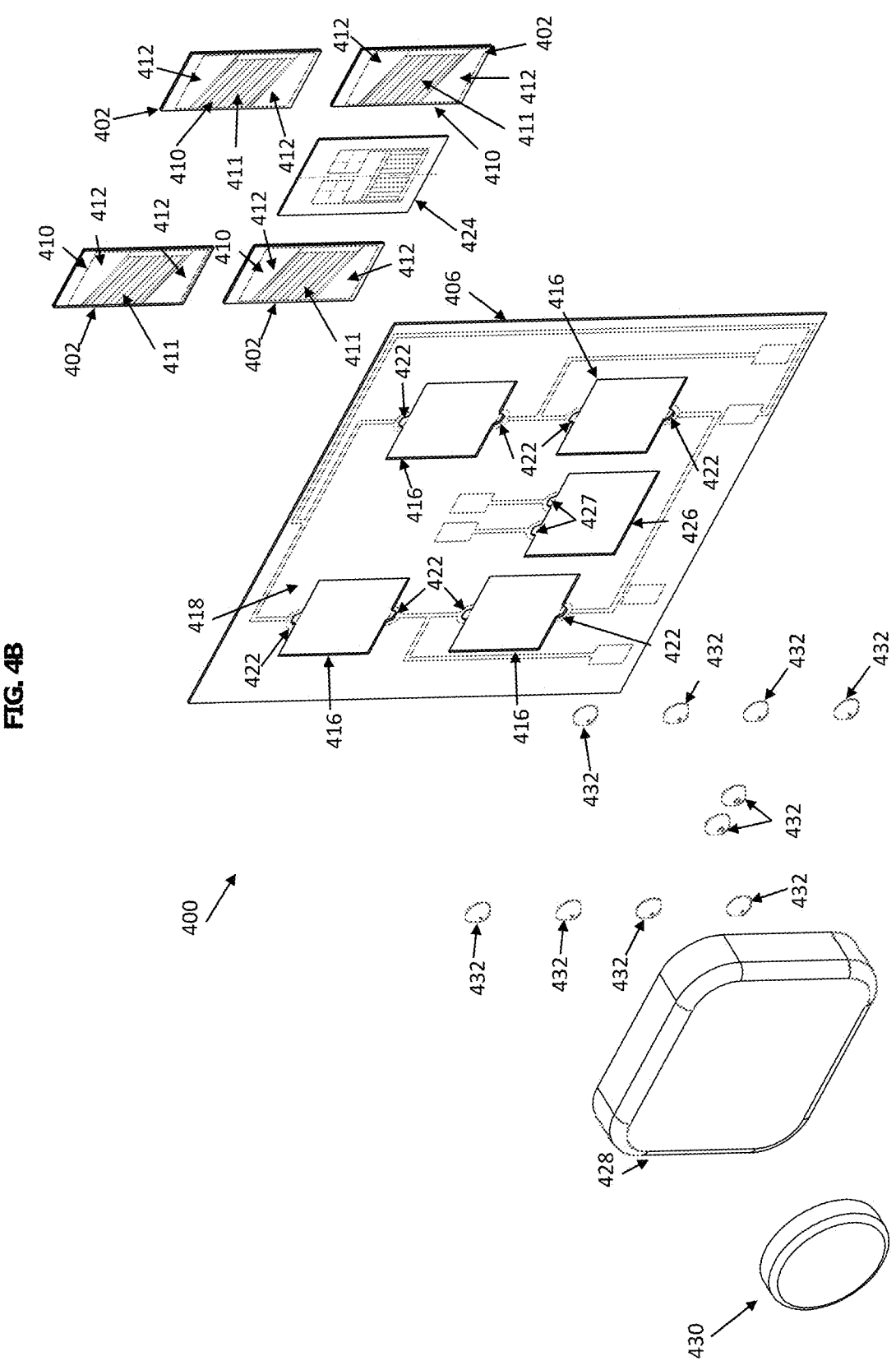
Figure 4C:
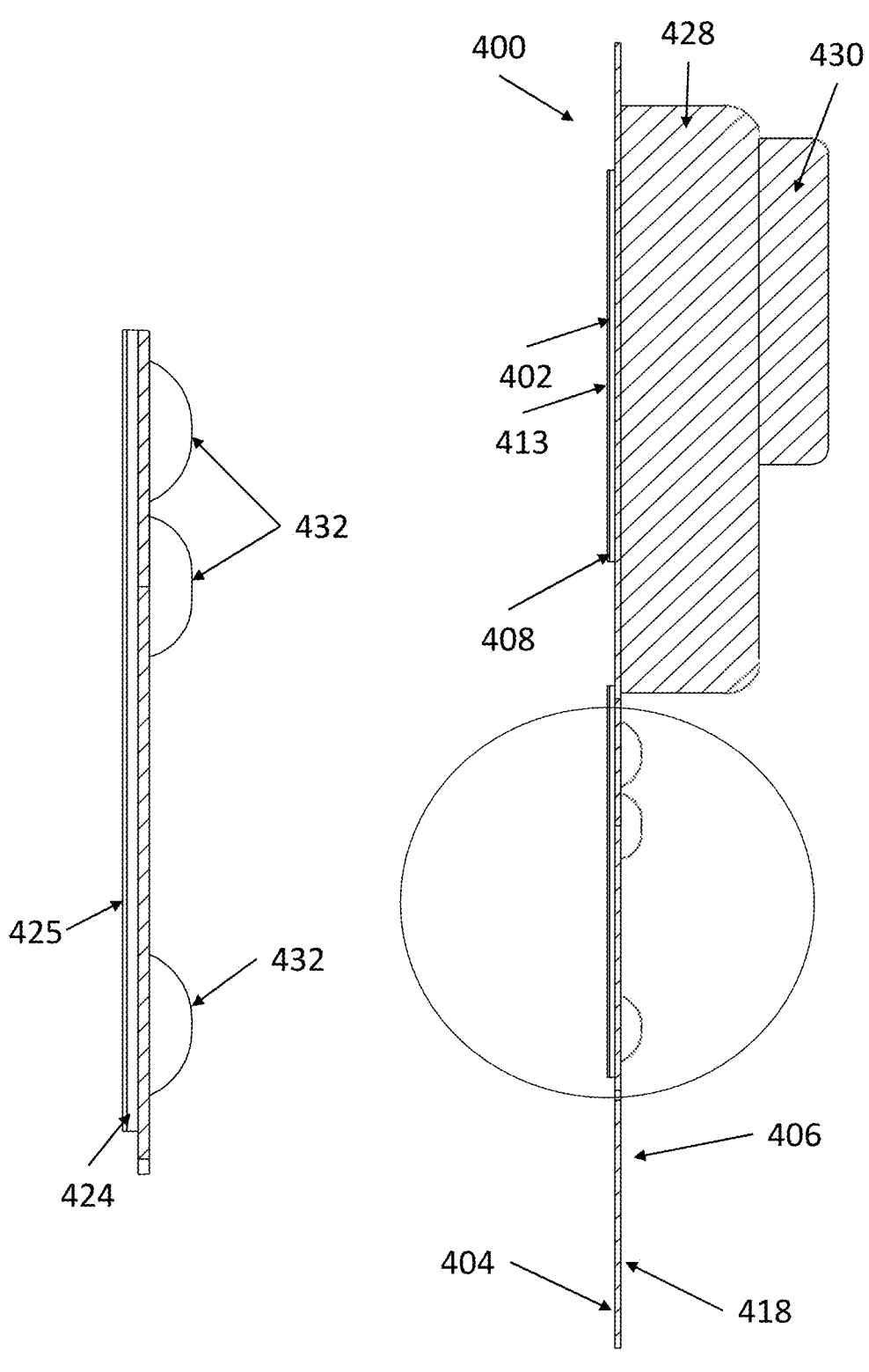
Figure 4D:
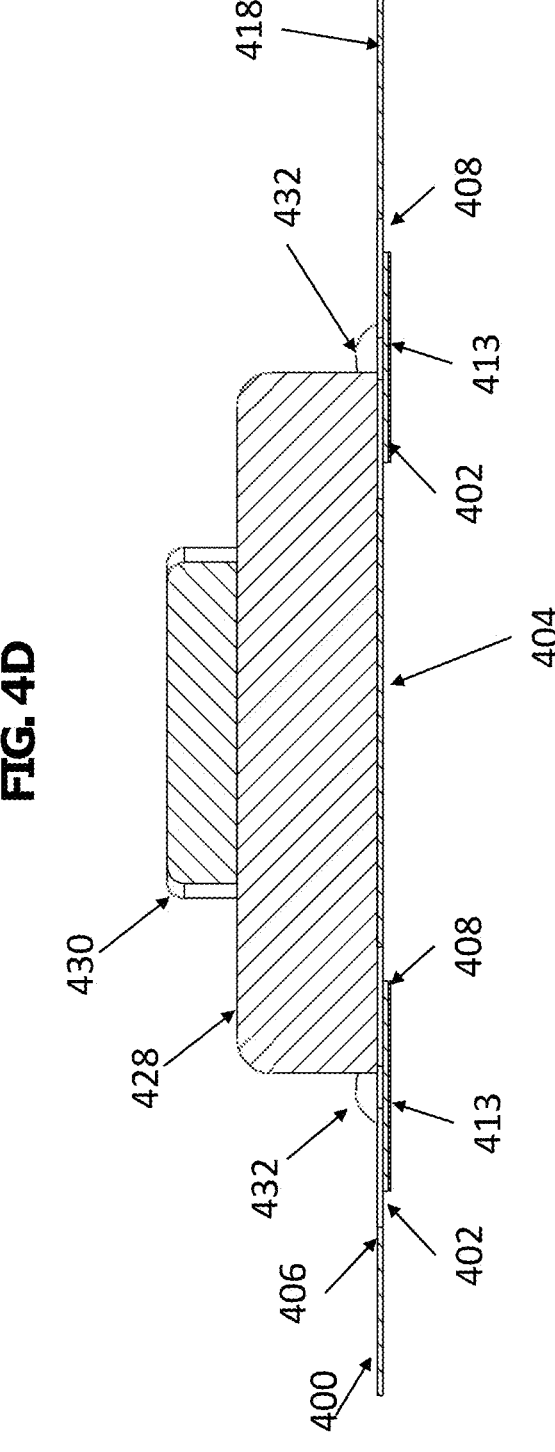

Strain gauges 402 each include a back surface 408 and a front surface 410. The front surface 410 of each strain gauge 402, which is seen clearly in FIGS. 4A and 4B, is formed with a patterned conductor 411 and at least two pads 412. It is a particular feature of an embodiment of the present invention that at least one of, and preferably all of, strain gauges 402 are self-adhesive strain gauges, such as a Model MMF404432, commercially available from VISHAY ADVANCED TECHNOLOGIES, LTD, in which the back surface 408 of each of the strain gauges 402 is pre-formed with an adhesive 413, preferably a layer of M-bond 43-B, commercially available from VISHAY ADVANCED TECHNOLOGIES, LTD, which is preferably applied by spin coating.

Preferably the strain gauges 402 each are aligned with a window 416 cut out of the flexible printed circuit board 406, such that the front surface 410 of each strain gauge 402 may be visible from a front surface 418 of the flexible printed circuit board 406.

Preferably, the front surface 418 of the printed circuit board 406 is formed with a patterned conductor 420. Preferably adjacent at least one edge of each window, the patterned conductor 420 defines a partial outline 422 of a pad in the shape of a protrusion, here shown as a semicircle.

In the illustrated embodiment of FIGS. 4A-4D, there may also be a flexible component, such as a temperature measuring circuit 424, such as a MMF006911, commercially available from VISHAY ADVANCED TECHNOLOGIES, LTD, which may include a resistance temperature detector (RTD), which may be mounted onto the back surface 404 of the flexible printed circuit board 406, in a manner similar to the mounting of the strain gauges 402. As seen in the illustrated embodiment, temperature measuring circuit 424 may also include an adhesive layer 425. Adhesive layer 425 may also be obviated.

In the illustrated embodiment, a window 426 cut out of the flexible printed circuit board 406 is provided, such that the temperature measuring circuit 424 may be visible from front surface 418 of the flexible printed circuit board 406. As illustrated, preferably adjacent at least one edge of window 426, the patterned conductor 420 defines a partial outline 427 of a pad in the shape of a protrusion, here shown as a semicircle.

In the illustrated embodiment of FIGS. 4A-4D, there are preferably additionally mounted additional components 428 and 430, such as a passive electronic component, an active electronic component, a battery, an integrated circuit, which may be mounted onto the front surface 418 of the flexible printed circuit board 406.

In accordance with a preferred embodiment of the present invention, pad-defining metal deposits 432, such as solder balls, are adhered to the flexible printed circuit board 406 and are partially surrounded by partial outlines 422 and 427. It is a particular feature of the invention that the partial outlines 422 and 427 enable case of providing the metal deposits so that they simultaneously conductively engage both the patterned conductor 420 of the flexible printed circuit board 406 and either at least one pad 412 of the strain gauge 402 or temperature measuring circuit 424.

Reference is now made to FIGS. 5A-1 and 5A-2, which, together, are a simplified illustrated flowchart illustrating prior art techniques for mounting of a strain gauge 502 onto a strainable surface, which is here defined as a surface of an article, such as a transducer or a wing strut of airplane or a boom of a crane, the strain of which it is desired to monitor and/or measure.

Before mounting strain gauge 502 on a strainable surface, the strainable surface is, typically, initially cleaned and alignment markings are provided thereon for marking a desired strain gauge position on the strainable surface.

As seen at step 1, in the prior art, a separate glass surface 504 is provided and cleaned, as with isopropanol or another suitable cleaning material, as illustrated.

As seen at step 2, in the prior art, as illustrated, strain gauge 502 is placed on glass surface 504, and is attached thereto by applying a piece of Mylar® tape 506 over the strain gauge 502 in a manner so as to ensure that the Mylar tape 506 covers the pads of the strain gauge 502 and that the elongate axis of the Mylar tape 506 is aligned with the elongate axis of the strain gauge 502.

As seen at step 3, in the prior art, as illustrated, the Mylar® tape 506, having the strain gauge 502 attached thereto, is then removed from the glass surface 504.

As seen at step 4, in the prior art, as illustrated, the strain gauge 502, adhered to the Mylar® tape 506, is positioned on a strainable surface 508.

As seen at step 5, in the prior art, as illustrated, the strain gauge 502, while adhered to the Mylar® tape 506, is subsequently removed from the strainable surface 508 by lifting an end 510 of the Mylar® tape 506 adjacent to the strain gauge 502 at a shallow angle with respect to the strainable surface 508.

As seen at step 6, in the prior art, as illustrated, an adhesive, such as M-bond 43-B or M-Bond 610, commercially available from VISHAY ADVANCED TECHNOLOGIES, LTD, is applied to a back surface 512 of the strain gauge 502.

As seen at step 7, in the prior art, as illustrated, an adhesive, such as M-bond 43-B or M-Bond 610, commercially available from VISHAY ADVANCED TECHNOLOGIES, LTD, is applied to a location on the strainable surface 508 which will underlie the strain gauge 502.

As seen at step 8, the adhesives are allowed to set, typically for 5-30 minutes.

As seen at step 9, in the prior art, as illustrated, excess adhesive is removed from the back surface 512 of the strain gauge 502 and the strain gauge is fixed to the strainable surface 508.

As seen at step 10, in the prior art, steps 1-9 above are repeated for each strain gauge which is mounted onto the strainable surface.

As seen at step 11, in the prior art, as illustrated, a stacked arrangement of a layer of Teflon® and rubber overlying the strain gauges and the strainable surface 508 is provided.

As seen at step 12, in the prior art, as illustrated, the stacked arrangement of a layer of Teflon® and rubber overlying the strain gauges 502 and the strainable surface 508 is clamped in order to apply pressure to the strain gauges 502 against the strainable surface 508.

As seen at step 13, in the prior art, the adhesive or adhesives, bonding the strain gauges 502 to the strainable surface 508, is activated by applying heat, as in an oven.

As seen at step 14, in the prior art, as illustrated, a flexible printed circuit board is mounted onto front surfaces 524 of the strain gauges 502 and over the strainable surface 508.

Reference is now made to FIGS. 5B-1 and 5B-2, which, together, are a simplified illustration of a prior art method of mounting strain gauges 552, premounted onto a flexible printed circuit board 554, onto a strainable surface 555.

Before mounting strain gauge 552 on strainable surface 555, the strainable surface 555 is, typically, initially cleaned and alignment markings are provided thereon for marking a desired strain gauge position on the strainable surface 555.

As seen at step 1, in the prior art, a separate glass surface 556 is provided and cleaned, as with isopropanol or another suitable cleaning material, as illustrated.

As seen at step 2, in the prior art, as illustrated, a piece of Mylar® tape 557 is applied over the strain gauges 552 and the flexible printed circuit board 554 in a manner so as to ensure that the Mylar tape covers the pads of the strain gauges 552 and that the elongate axis of the Mylar tape 557 is aligned with the elongate axes of the strain gauges 552.

As seen at step 3, in the prior art, as illustrated, the Mylar® tape 557, having the strain gauges 552 and the flexible printed circuit board 554 attached thereto, is removed from the glass surface 556.

As seen at step 4, in the prior art, as illustrated, the strain gauges 552 and the flexible printed circuit board 554, adhered to the Mylar® tape 557, are positioned on strainable surface 555.

As seen at step 5, in the prior art, as illustrated, the strain gauge 552 and the flexible printed circuit 554, while adhered to the Mylar® tape 557, are subsequently removed from the strainable surface 555 by lifting an end 560 of the Mylar® tape 557 adjacent to the strain gauges 552 at a shallow angle with respect to the strainable surface 508.

As seen at step 6, in the prior art, as illustrated, an adhesive, such as M-bond 43-B or M-Bond 610, commercially available from VISHAY ADVANCED TECHNOLOGIES, LTD, is applied to back surfaces 562 of the strain gauges 552.

As seen at step 7, in the prior art, as illustrated, an adhesive, such as M-bond 43-B or M-Bond 610, commercially available from VISHAY ADVANCED TECHNOLOGIES, LTD, is applied to a location on the strainable surface 555 which will underlie each strain gauge 552.

As seen at step 8, the adhesives are allowed to set, typically for 5-30 minutes.

As seen at step 9, in the prior art, as illustrated, excess adhesive is removed from the back surfaces 562 of the strain gauges 552 and the strain gauges 552 and the flexible printed circuit board 554 are fixed to the strainable surface 555.

As seen at step 10, in the prior art, as illustrated, a stacked arrangement of a layer of Teflon® and rubber overlying the strain gauges 552 and the flexible printed circuit board 554 and the strainable surface 555.

As seen at step 11, in the prior art, as illustrated, the stacked arrangement of a layer of Teflon® and rubber overlying the strain gauges 552, the flexible printed circuit board 554 and the strainable surface 555 is clamped in order to apply pressure to the strain gauges 552 against the strainable surface 555.

As seen at step 12, in the prior art, the adhesive or adhesives, bonding the strain gauges 552 to the strainable surface 555, is activated by applying heat or in any other suitable manner.

Reference is now made to FIG. 6, which is a simplified illustrated flowchart illustrating techniques in accordance with a preferred embodiment of the present invention, for mounting of a strain gauge assembly 600, such as that of FIGS. 1A-4D, onto a strainable surface 610, which is defined as a surface of an article, such a transducer or a wing strut of airplane or a boom of a crane, the strain of which it is desired to monitor and/or measure.

Before mounting strain gauge assembly 600 on strainable surface 610, the strainable surface 610 is, typically, initially cleaned and alignment markings are provided thereon for marking a desired strain gauge assembly position on the strainable surface 610.

As seen as step 1, strain gauge assembly 600 is located at the desired strain gauge assembly position on the strainable surface 610.

As seen at step 2, as illustrated, strain gauge assembly 600 is initially fixed in place at the desired strain gauge assembly position on the strainable surface 610, as by taping strain gauge assembly 600 to strainable surface 610. Alternatively, strain gauge assembly 600 may be initially fixed to strainable surface 610 by gluing a flexible printed circuit board, forming part of strain gauge assembly 600, to strainable surface 610.

As seen at step 3, as illustrated, a stacked arrangement of a layer of Teflon® and rubber overlying the assembly 600 and the strainable surface 610 is provided.

As seen at step 4, as illustrated, the stacked arrangement of a layer of Teflon® and rubber overlying the assembly 600 and the strainable surface 610 is clamped in order to apply pressure to the assembly 600 against the strainable surface 610.

As seen at step 5, the adhesive bonding the assembly 600 to the strainable surface 610 is activated by applying heat or in any other suitable manner.

From the preceding description of FIGS. 5A-1, 5A-2, 5B-1, 5B-2 & 6, it is seen that the mounting method of FIG. 6 is substantially more efficient and less labor and time intensive than the prior art methods.

It will be appreciated by persons skilled in the that the present invention is not limited to what has been specifically described hereinabove. Rather the scope of the present invention is defined only by the claims which follow:

The invention claimed is:

1. An integrated strain gauge assembly comprising:
   at least one strain gauge having an adhesive adhered to a surface thereof; and
   a flexible printed circuit board fixed to said at least one strain gauge,
   said flexible printed circuit board being formed with at least one window at least partially overlying said at least one strain gauge.

2. An integrated strain gauge assembly according to claim 1 and also comprising at least one circuit component mounted onto said flexible printed circuit board.

3. An integrated strain gauge assembly according to claim 2 and wherein said circuit component includes a passive electronic component.

4. An integrated strain gauge assembly according to claim 2 and wherein said at least one circuit component includes an active electronic component.

5. An integrated strain gauge assembly according to claim 2 and wherein said at least one circuit component includes a battery.

6. An integrated strain gauge assembly according to claim 2 and wherein said at least one circuit component includes at least one integrated circuit.

7. An integrated strain gauge assembly according to claim 2 and wherein said at least one circuit component includes a flexible electronic component.

8. An integrated strain gauge assembly comprising:
   at least one strain gauge having an adhesive adhered to a surface thereof;
   a flexible printed circuit board fixed to said at least one strain gauge, said flexible printed circuit board being formed with at least one conductor shaped as a partial outline of a pad; and
   at least one pad-defining metal deposit adhered to said flexible printed circuit board and partially surrounded by said at least one conductor shaped as a partial outline of a pad.

9. An integrated strain gauge assembly according to claim 8 and also comprising at least one circuit component mounted onto said flexible printed circuit board.

10. An integrated strain gauge assembly according to claim 9 and wherein said at least one circuit component includes a temperature measuring circuit.

11. An integrated strain gauge assembly according to claim 9 and wherein said at least one circuit component includes a passive electronic component.

12. An integrated strain gauge assembly according to claim 9 and wherein said at least one circuit component includes an active electronic component.

13. An integrated strain gauge assembly according to claim 9 and wherein said at least one circuit component includes a battery.

14. An integrated strain gauge assembly according to claim 9 and wherein said at least one circuit component includes at least one integrated circuit.

15. An integrated strain gauge assembly according to claim 9 and wherein said at least one circuit component includes a flexible electronic component.

16. An integrated strain gauge assembly comprising:
   at least one strain gauge having an adhesive adhered to a surface thereof;
   a flexible printed circuit board fixed to said at least one strain gauge; and
   at least one circuit component mounted onto said flexible printed circuit board,
   said at least one circuit component including a temperature measuring circuit.

17. A method for mounting a strain gauge assembly onto a strainable surface, the method comprising:
   providing a strain gauge assembly, said strain gauge assembly including at least one strain gauge having an adhesive adhered to a surface thereof and a flexible printed circuit board fixed to said at least one strain gauge, said flexible printed circuit board being formed with at least one window at least partially overlying said at least one strain gauge;
   locating said strain gauge assembly at a desired strain gauge assembly position on said strainable surface; and
   initially fixing said strain gauge assembly at said desired strain gauge assembly position on said strainable surface.

18. A method according to claim 17 and also comprising:
   providing a stacked arrangement overlying said strain gauge assembly and said strainable surface;
   applying pressure to said stacked arrangement, thereby applying pressure to said strain gauge assembly and said strainable surface; and
   bonding said strain gauge assembly to said strainable surface by activating said adhesive.

\* \* \* \* \*